(12) United States Patent
Kim et al.

(10) Patent No.: US 12,453,107 B2
(45) Date of Patent: Oct. 21, 2025

(54) SEMICONDUCTOR DEVICE AND SEMICONDUCTOR PACKAGE INCLUDING THE SAME

(71) Applicant: Samsung Electronics Co., Ltd., Suwon-si (KR)

(72) Inventors: Jingu Kim, Suwon-si (KR); Doohwan Lee, Anyang-si (KR); Sangkyu Lee, Suwon-si (KR); Jeongho Lee, Suwon-si (KR); Taesung Jeong, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 462 days.

(21) Appl. No.: 17/901,386

(22) Filed: Sep. 1, 2022

(65) Prior Publication Data

US 2023/0142938 A1    May 11, 2023

(30) Foreign Application Priority Data

Nov. 10, 2021    (KR) .................. 10-2021-0154135

(51) Int. Cl.
*H01L 49/02*        (2006.01)
*H01L 23/498*       (2006.01)
(Continued)

(52) U.S. Cl.
CPC ....... *H10D 1/712* (2025.01); *H01L 23/49816* (2013.01); *H01L 23/49822* (2013.01);
(Continued)

(58) Field of Classification Search
CPC .............. H10D 1/712; H01L 23/49816; H01L 23/49822; H01L 23/49827; H01L 23/5383; H01L 23/5384; H01L 23/5385; H01L 23/481; H01L 25/18; H01L 24/05; H01L 24/13; H01L 24/16; H01L 24/32; H01L 24/73; H01L 24/81; H01L 2224/05624; H01L 2224/05647; H01L 2224/05666; H01L 2224/05684; H01L 2224/13111; H01L 2224/13113; H01L 2224/13116; H01L 2224/13118; H01L 2224/13124; H01L 2224/13139; H01L 2224/13144; H01L 2224/13147; H01L 2224/13155;
(Continued)

(56) References Cited

U.S. PATENT DOCUMENTS 7,327,554 B2 * 2/2008 Otsuka ................. H05K 1/0231
                                                 257/E23.079
8,179,689 B2 * 5/2012 Mashino ............. H01L 21/6835
                                                 361/761
(Continued)

FOREIGN PATENT DOCUMENTS

| JP | 2021093410 A | 6/2021 |
|---|---|---|
| KR | 100333130 B1 | 9/2002 |
| KR | 10-2021-0050254 A | 5/2021 |

*Primary Examiner* — Peniel M Gumedzoe
(74) *Attorney, Agent, or Firm* — Muir Patent Law, PLLC

(57) ABSTRACT

A semiconductor device includes a substrate having a recess region, a first electrode in the recess region and having a three-dimensional network structure, a first dielectric layer in the recess region and covering the first electrode, a second electrode in the recess region and covering the first dielectric layer, and a molding layer filling a remaining portion of the recess region and covering the second electrode.

20 Claims, 14 Drawing Sheets

(51) Int. Cl.
*H01L 23/538* (2006.01)
*H01L 25/18* (2023.01)
*H10D 1/68* (2025.01)
*H01L 23/00* (2006.01)
*H01L 23/48* (2006.01)

(52) U.S. Cl.
CPC .... *H01L 23/49827* (2013.01); *H01L 23/5383* (2013.01); *H01L 23/5384* (2013.01); *H01L 23/5385* (2013.01); *H01L 25/18* (2013.01); H01L 23/481 (2013.01); H01L 24/05 (2013.01); H01L 24/13 (2013.01); H01L 24/16 (2013.01); H01L 24/32 (2013.01); H01L 24/73 (2013.01); H01L 24/81 (2013.01); H01L 2224/05624 (2013.01); H01L 2224/05647 (2013.01); H01L 2224/05666 (2013.01); H01L 2224/05684 (2013.01); H01L 2224/13111 (2013.01); H01L 2224/13113 (2013.01); H01L 2224/13116 (2013.01); H01L 2224/13118 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/16145 (2013.01); H01L 2224/16227 (2013.01); H01L 2224/32145 (2013.01); H01L 2224/32225 (2013.01); H01L 2224/73204 (2013.01); H01L 2224/81424 (2013.01); H01L 2224/81447 (2013.01); H01L 2224/81466 (2013.01); H01L 2224/81484 (2013.01)

(58) Field of Classification Search
CPC . H01L 2224/16145; H01L 2224/16227; H01L 2224/32145; H01L 2224/32225; H01L 2224/73204; H01L 2224/81424; H01L 2224/81447; H01L 2224/81466; H01L 2224/81484
See application file for complete search history.

(56) References Cited

U.S. PATENT DOCUMENTS

| | | |
|---|---|---|
| 8,587,928 B2 | 11/2013 | Fujiwara |
| 2005/0207091 A1* | 9/2005 | Kambe ............... H05K 1/0231 257/E23.079 |
| 2008/0291604 A1 | 11/2008 | Kuriyama |
| 2012/0099242 A1 | 4/2012 | Ohyama et al. |
| 2013/0009515 A1 | 1/2013 | Kim et al. |
| 2013/0045385 A1 | 2/2013 | Kim et al. |

* cited by examiner

SEMICONDUCTOR DEVICE AND SEMICONDUCTOR PACKAGE INCLUDING THE SAME

CROSS-REFERENCE TO RELATED APPLICATIONS

This U.S. non-provisional patent application claims priority under 35 U.S.C. § 119 to Korean Patent Application No. 10-2021-0154135, filed on Nov. 10, 2021, in the Korean Intellectual Property Office, the entire contents of which are hereby incorporated by reference.

TECHNICAL FIELD

The present disclosure relates to a semiconductor device and a semiconductor package including the same, and more particularly, to a semiconductor device including a capacitor having a three-dimensional structure and a semiconductor package including the same.

DISCUSSION OF RELATED ART

As semiconductor devices have been highly integrated, capacitors having sufficient capacitances in a limited area have been demanded. A capacitance of a capacitor may be proportional to a surface area of an electrode and a dielectric constant of a dielectric layer and may be inversely proportional to an equivalent oxide thickness (EOT) of the dielectric layer. Thus, to increase the capacitance of the capacitor in a limited area, a capacitor having a three-dimensional structure may be formed to increase the surface area of the electrode, the equivalent oxide thickness of the dielectric layer may be reduced, and/or a material having a high dielectric constant may be used as the dielectric layer.

SUMMARY

Some embodiments of the present inventive concepts may provide a semiconductor device with an improved capacitance.

Some embodiments of the present inventive concepts may also provide a semiconductor package including a capacitor with an improved capacitance.

According to some embodiments of the present inventive concepts, a semiconductor device may include a substrate having a recess region, a first electrode in the recess region and having a three-dimensional network, a first dielectric layer in the recess region and covering the first electrode, a second electrode in the recess region and covering the first dielectric layer, and a molding layer filling a remaining portion of the recess region and covering the second electrode.

According to some embodiments of the present inventive concepts, a semiconductor package may include an interposer substrate, and a semiconductor chip mounted on a top surface of the interposer substrate. The interposer substrate may include a substrate layer having a recess region, a capacitor in the recess region, and an interconnection layer on the substrate layer. The capacitor may include a first electrode having a three-dimensional network structure with first embossed surfaces, a first dielectric layer covering the first embossed surfaces of the first electrode to have second embossed surfaces, and a second electrode covering the second embossed surfaces of the first dielectric layer.

According to some embodiments of the present inventive concepts, a semiconductor package may include an interposer substrate comprising a capacitor therein, a first semiconductor chip mounted on a top surface of the interposer substrate, and external terminals on a bottom surface of the interposer substrate. The capacitor may include a first electrode having a three-dimensional network structure in which particles are connected with each other, a first dielectric layer covering the first electrode, a second electrode covering the first dielectric layer, a first electrode pad connected to the first electrode, and a second electrode pad connected to the second electrode.

DETAILED DESCRIPTION

Example embodiments of the present inventive concepts will now be described more fully with reference to the accompanying drawings.

Figure 1:
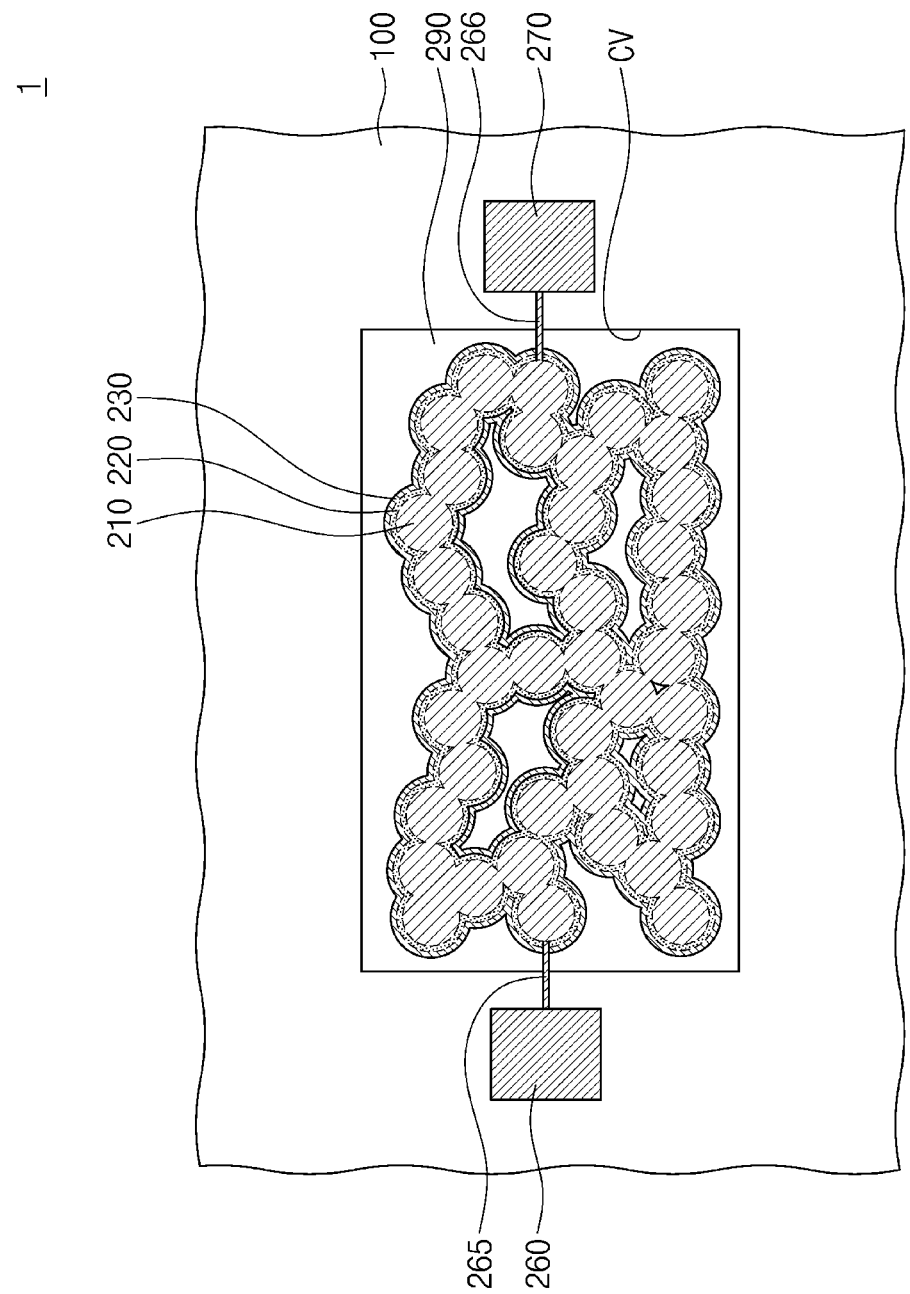
FIG. 1 is a plan view illustrating a semiconductor device according to some embodiments of the present inventive concepts.
Figure 2:
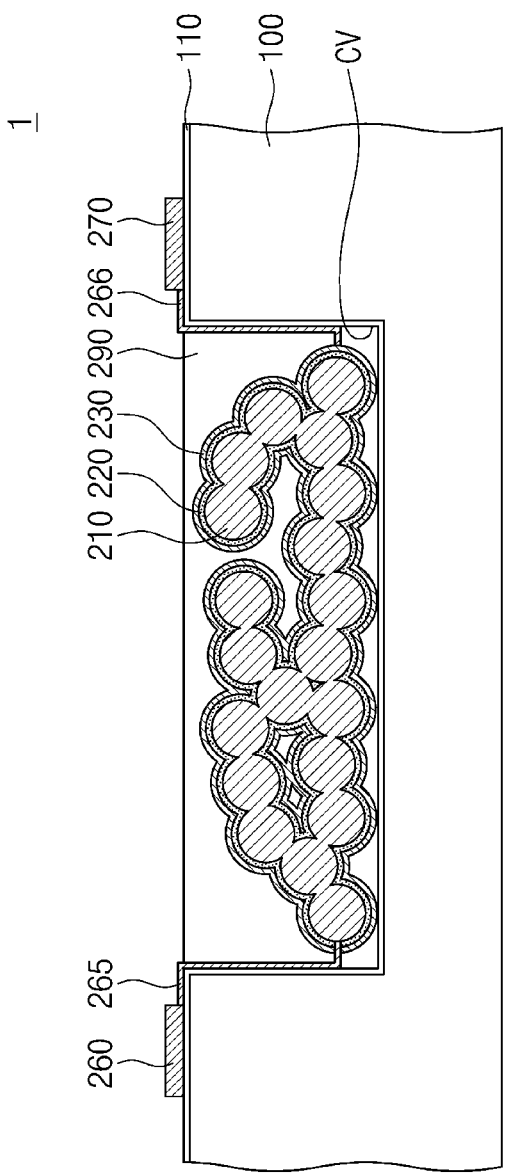
FIG. 2 is a cross-sectional view illustrating a semiconductor device according to some embodiments of the present inventive concepts.

FIG. 1 is a plan view illustrating a semiconductor device according to some embodiments of the present inventive concepts. FIG. 2 is a cross-sectional view illustrating a semiconductor device according to some embodiments of the present inventive concepts.

Referring to FIGS. 1 and 2, a semiconductor device 1 may include a substrate 100. The semiconductor device 1 according to some embodiments of the present inventive concepts may include a passive device and may include, for example, a capacitor.

The substrate 100 may be a semiconductor substrate. For example, the substrate 100 may include or may be at least one of a silicon substrate, a germanium substrate, and a silicon-germanium substrate. The substrate 100 may have a recess region CV. The recess region CV may be a region in which a portion of a top surface of the substrate 100 is recessed toward a bottom surface of the substrate 100.

An insulating layer 110 may be provided on the substrate 100. The insulating layer 110 may cover the top surface of the substrate 100 and may fill a portion of the recess region CV. The insulating layer 110 may conformally cover a bottom surface and inner side surfaces of the recess region CV. For example, the insulating layer 110 may include or may be formed of at least one of silicon oxide, silicon nitride, and silicon oxynitride.

A capacitor according to some embodiments of the present inventive concepts may be provided in the recess region CV. The capacitor may include a first electrode 210, a first dielectric layer 220, and a second electrode 230.

The first electrode 210 may be provided in the recess region CV. The first electrode 210 may have a three-dimensional network structure. More particularly, the first electrode 210 may have a shape in which particles are connected to each other in a three-dimensional network structure. For example, the particles may be arranged such that each particle contacts one or at least two particles among the particles to form the three-dimensional network structure. The three-dimensional network structure (i.e., the particles connected with each other) may have embossed surfaces, thereby increasing a surface of the first electrode 210. In an embodiment, the particles may randomly contact each other in a process (e.g., a sintering process) of forming the first electrode 210 in the recess region CV. The particles may be connected to each other by a sintering process to form the first electrode 210. The first electrode 210 may include or may be formed of a conductive metal material. The particles may include or may be at least one of metal particles and polymer particles plated with (i.e., covered with) metal. For some examples, the particles may include or may be metal particles including at least one of Cu, Ni, W, Ba, Ti, Sr, Al, Au, Ag, and Ta. For some examples, the particles may include or may be at least one of polystyrene particles plated with metal or silicone particles plated with metal. Here, the metal may include or may be at least one of Cu, Ni, W, Ba, Ti, Sr, Al, Au, Ag, and Ta.

The first dielectric layer 220 may be provided in the recess region CV. The first dielectric layer 220 may cover the first electrode 210. The first dielectric layer 220 may conformally cover a surface of the first electrode 210. In an embodiment, the first dielectric layer 220 may conformally cover first embossed surfaces of the first electrode 210, and the first dielectric layer 220 covering the first electrode 210 may have second embossed surfaces. The second electrode 230 may cover the second embossed surfaces of the first dielectric layer 220. The first electrode 210 and the second electrode 230 may be spaced apart from each other by the first dielectric layer 220. The first dielectric layer 220 may include or may be formed of an inorganic material or an organic material. For example, the inorganic material may include or may be at least one of silicon oxide, silicon nitride, glass, tantalum oxide, barium-titanium oxide, strontium-titanium oxide, and a transition metal oxide. For example, the organic material may include or may be at least one of polyvinylidene fluoride (PVDF), silicone, novolac type phenol, resol type phenol, novolac type epoxy, resol type epoxy, poly hydroxy styrene, polyimide, and polybenzoxazoles (PBO). For example, a dielectric constant of the first dielectric layer 220 may range from 2 to 8,000 (i.e., may be a value between 2 and 8,000).

The second electrode 230 may be provided in the recess region CV. The second electrode 230 may cover the first dielectric layer 220. The second electrode 230 may conformally cover a surface of the first dielectric layer 220. In an embodiment, the second electrode 230 may conformally cover embossed surfaces of the first dielectric layer 220. The second electrode 230 may include a conductive metal material. For example, the second electrode 230 may include or may be at least one of Cu, Ni, W, Ba, Ti, Sr, Al, Au, Ag, and Ta.

The capacitor according to some embodiments of the present inventive concepts may further include a first electrode pad 260, a second electrode pad 270, a first connection line 265, and a second connection line 266. The first electrode pad 260 may be disposed on the top surface of the substrate 100. The first electrode pad 260 may be electrically connected to the first electrode 210. The first electrode pad 260 may include or may be formed of a conductive metal material. For example, the first electrode pad 260 may include or may be formed of at least one of Cu, Ni, W, Ba, Ti, Sr, Al, Au, Ag, and Ta. In the present specification, it may be understood that when a component is referred to as being 'electrically connected or coupled' to another component, it may be directly connected or coupled to the other component or at least one intervening component may be present.

The second electrode pad 270 may be disposed on the top surface of the substrate 100. The second electrode pad 270 may be horizontally spaced apart from the first electrode pad 260. The second electrode pad 270 may be electrically connected to the second electrode 230. The second electrode pad 270 may include or may be formed of a conductive metal material. For example, the second electrode pad 270 may include or may be formed of at least one of Cu, Ni, W, Ba, Ti, Sr, Al, Au, Ag, and Ta.

The first connection line 265 may be disposed between the first electrode 210 and the first electrode pad 260. The second connection line 266 may be disposed between the second electrode 230 and the second electrode pad 270. The first electrode 210 and the first electrode pad 260 may be electrically connected to each other through the first connection line 265. The second electrode 230 and the second electrode pad 270 may be electrically connected with each other through the second connection line 266. The first connection line 265 and the second connection line 266 may include or may be formed of a conductive metal material and may include or may be formed of at least one of, for example, Cu, Ni, W, Ba, Ti, Sr, Al, Au, Ag, and Ta.

A molding layer 290 may be provided on the substrate 100. The molding layer 290 may be disposed in the recess region CV. The molding layer 290 may fill a remaining portion of the recess region CV and may cover the second electrode 230. The molding layer 290 may expose a top surface of the first electrode pad 260 and a top surface of the second electrode pad 270. For example, the molding layer 290 may include or may be formed of an insulating polymer such as an epoxy molding compound (EMC).

The capacitor according to the embodiments of the present inventive concepts may have the three-dimensional network structure. More particularly, the first electrode 210, the first dielectric layer 220 and the second electrode 230 may have the three-dimensional network structure. In an embodiment, the three-dimensional network structure may have embossed surfaces. As a result, surface areas of the first electrode 210 and the second electrode 230 may be maximized, and thus a capacitance of the capacitor may be improved.

FIGS. 3, 4, 5, 6, 7 and 8 are cross-sectional views illustrating a method of manufacturing a semiconductor device according to some embodiments of the present inventive concepts. Hereinafter, the descriptions to the same features as mentioned above will be omitted for the purpose of ease and convenience in explanation.

Figure 3:
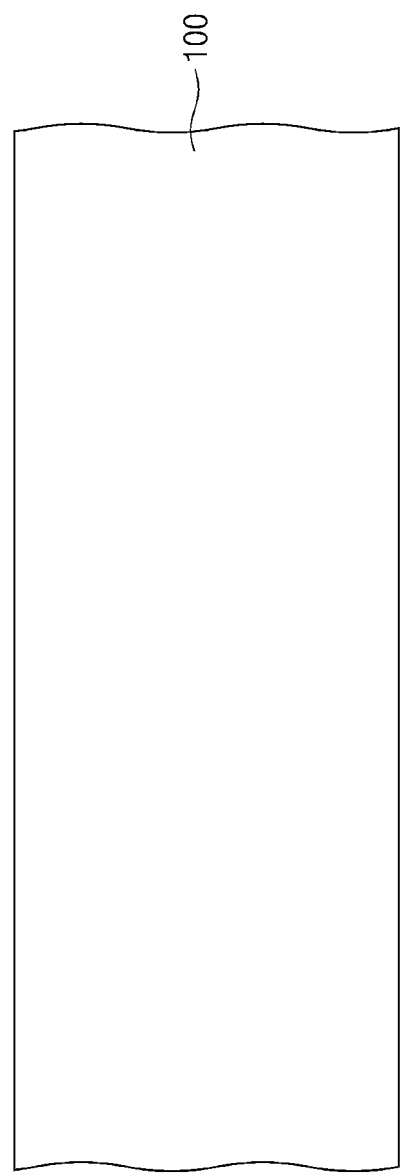
FIGS. 3, 4, 5, 6, 7 and 8 are cross-sectional views illustrating a method of manufacturing a semiconductor device according to some embodiments of the present inventive concepts.

Referring to FIG. 3, a substrate 100 may be provided. The substrate 100 may be a semiconductor substrate and may include or may be at least one of, for example, a silicon substrate, a germanium substrate, and a silicon-germanium substrate. For example, the substrate 100 may be a wafer-level substrate.

Figure 4:
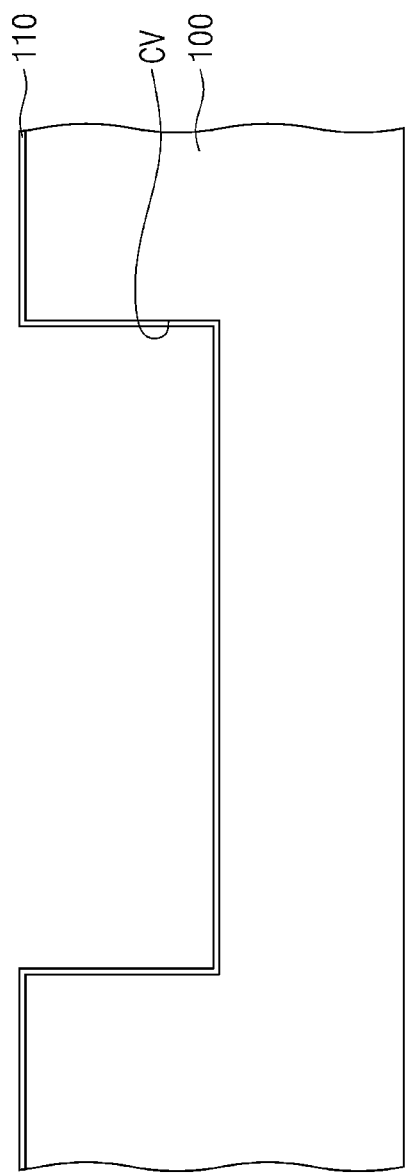

Referring to FIG. 4, a portion of a top surface of the substrate 100 may be recessed toward a bottom surface of the substrate 100 to form a recess region CV. The formation of the recess region CV may include performing an exposure process and a development process on the substrate 100 to form a mask pattern, and removing a portion of an upper portion of the substrate 100 by an etching process using the mask pattern as an etch mask.

An insulating layer 110 may be formed on the substrate 100. The insulating layer 110 may be formed to fill a portion of the recess region CV and may extend onto the top surface of the substrate 100. The insulating layer 110 may be formed to conformally cover a bottom surface and inner side surfaces of the recess region CV. The insulating layer 110 may include or may be formed of at least one of silicon oxide, silicon nitride, and silicon oxynitride.

Figure 5:
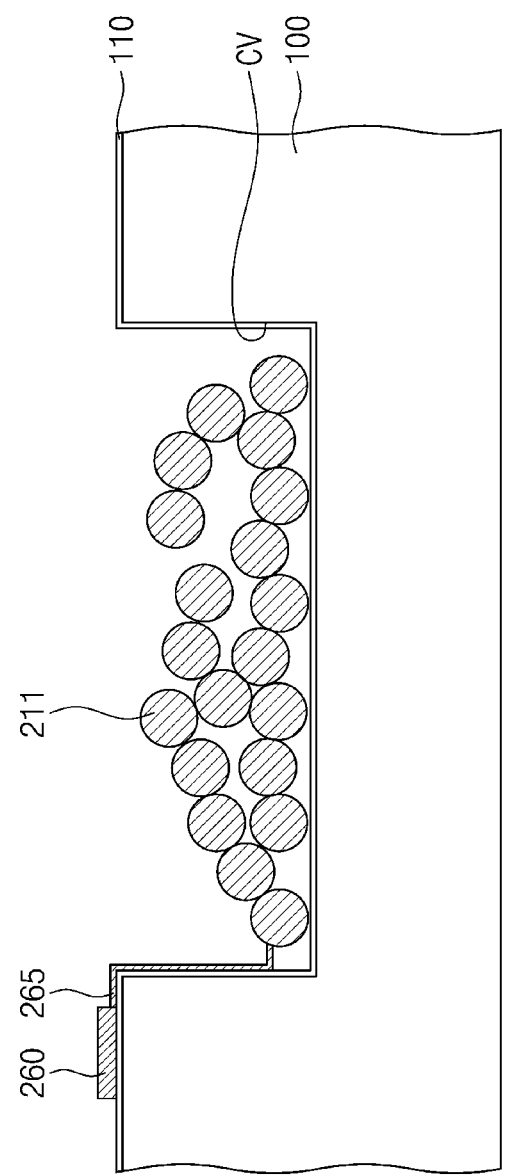

Referring to FIG. 5, a first electrode pad 260 may be formed on the substrate 100. The formation of the first electrode pad 260 may include forming a seed layer, and performing an electroplating process using the seed layer. The first electrode pad 260 may include at least one of Cu, Ni, W, Ba, Ti, Sr, Al, Au, Ag, and Ta. A plurality of conductive particles 211 may be formed in the recess region CV. The conductive particles 211 may include or may be at least one of metal particles and polymer particles plated with metal. For some examples, the conductive particles 211 may include or may be metal particles including at least one of Cu, Ni, W, Ba, Ti, Sr, Al, Au, Ag, and Ta. For some examples, the conductive particles 211 may include or may be at least one of polystyrene particles plated with metal or silicone particles plated with metal. Here, the metal may include or may be at least one of Cu, Ni, W, Ba, Ti, Sr, Al, Au, Ag, and Ta. A first connection line 265 may be formed between the first electrode pad 260 and one of the conductive particles 211. The present invention is not limited thereto. In an embodiment, the first connection line 265 may connect the first electrode pad 260 to two or more conductive particles of the conductive particles 211.

Figure 6:
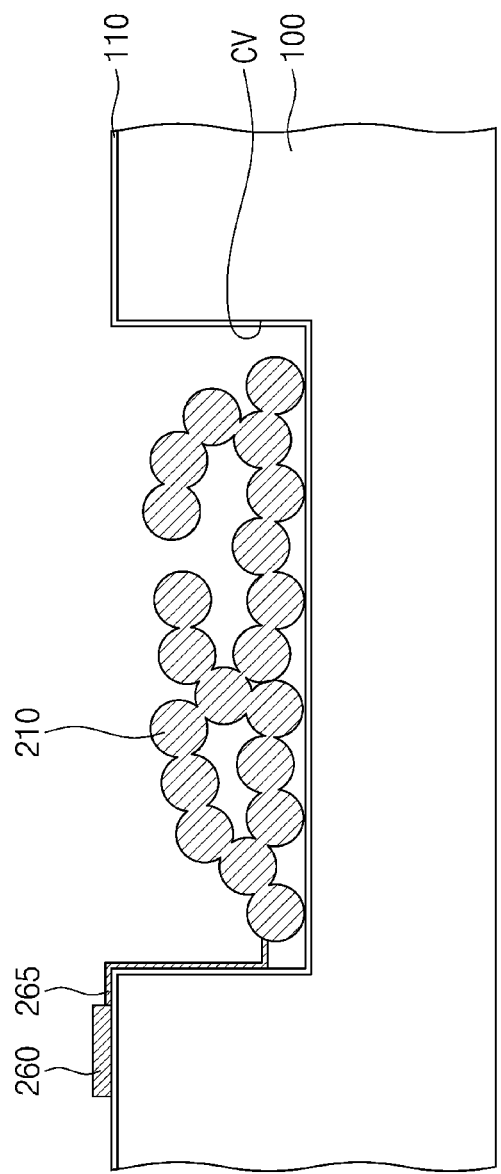

Referring to FIG. 6, a sintering process may be performed on the substrate 100. For example, the sintering process may include a thermal treatment process. The conductive particles 211 may be connected with each other by the sintering process, and thus a first electrode 210 having a three-dimensional network structure may be formed. By the sintering process, the first connection line 265 may be electrically connected to the first electrode 210, and the first connection line 265 may be electrically connected to the first electrode pad 260.

Figure 7:
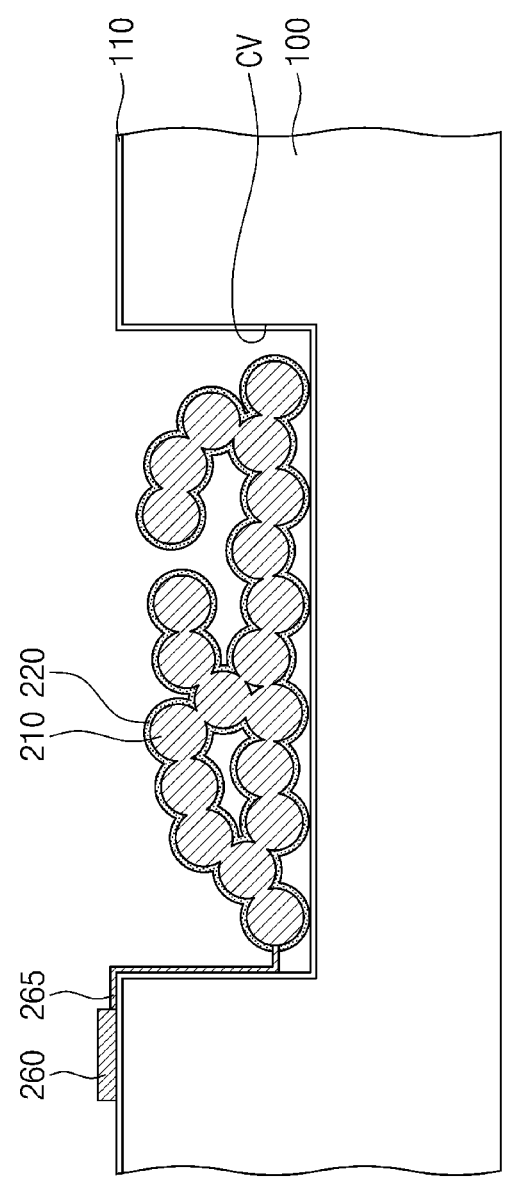

Referring to FIG. 7, a first dielectric layer 220 may be formed to surround a surface of the first electrode 210. The first dielectric layer 220 may conformally cover the first electrode 210. The formation of the first dielectric layer 220 may be performed by, for example, a chemical vapor deposition (CVD) process or a thermal oxidation process. For example, the first dielectric layer 220 may include or may be formed of at least one of silicon oxide, silicon nitride, glass, tantalum oxide, barium-titanium oxide, strontium-titanium oxide, a transition metal oxide, polyvinylidene fluoride (PVDF), silicone, novolac type phenol, resol type phenol, novolac type epoxy, resol type epoxy, poly hydroxy styrene, polyimide, and polybenzoxazoles (PBO).

Figure 8:
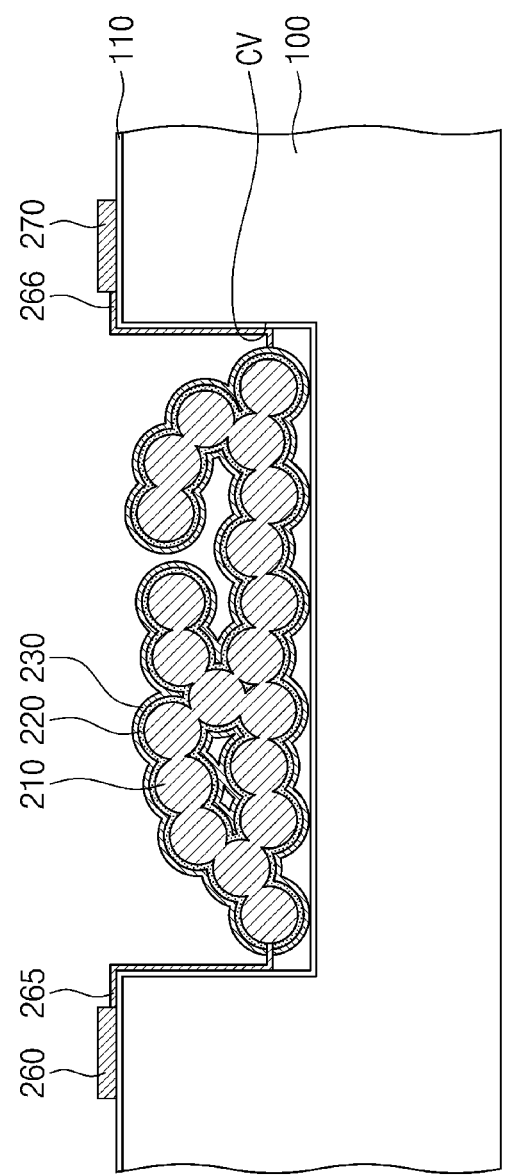

Referring to FIG. 8, a second electrode pad 270 may be formed on the substrate 100. The formation of the second electrode pad 270 may include forming a seed layer, and performing an electroplating process using the seed layer. A second electrode 230 may be formed to surround a surface of the first dielectric layer 220. The second electrode 230 may conformally cover the first dielectric layer 220. The formation of the second electrode 230 may be performed by, for example, a chemical vapor deposition (CVD) process, a physical vapor deposition (PVD) process, or an electroplating process. For example, the second electrode 230 may include or may be formed of at least one of Cu, Ni, W, Ba, Ti, Sr, Al, Au, Ag, and Ta. A second connection line 266 may be formed between the second electrode 230 and the second electrode pad 270 to electrically connect the second electrode 230 to the second electrode pad 270.

Referring again to FIGS. 1 and 2, a molding layer 290 may be formed on the substrate 100. The molding layer 290 may be formed to fill a remaining portion of the recess region CV. The molding layer 290 may expose a top surface of the first electrode pad 260 and a top surface of the second electrode pad 270. For example, the molding layer 290 may include an insulating polymer such as an epoxy molding compound (EMC).

A thinning process may be performed on the bottom surface of the substrate 100. By the thinning process, a portion of the substrate 100 may be removed and the substrate 100 may be thinned. For example, the thinning process may include an etching process or a grinding process. The semiconductor device 1 according to the embodiments of the present inventive concepts may be manufactured by the processes described above.

In a general case in which a capacitor having a stack structure is formed by alternately stacking electrodes and dielectric layers, high-temperature and high-pressure processes should be performed, and thus defects may occur in the dielectric layers to deteriorate reliability of a semiconductor device. On the contrary, according to the embodiments of the present inventive concepts, the sintering process may be performed to connect the conductive particles 211 to each other, thereby forming the first electrode 210. Since the capacitor is manufactured under relatively mild process conditions, occurrence of a defect in the first dielectric layer 220 may be prevented, and manufacturing processes may be simplified. As a result, according to the present inventive concepts, the semiconductor device with improved reliability may be provided.

Figure 9:
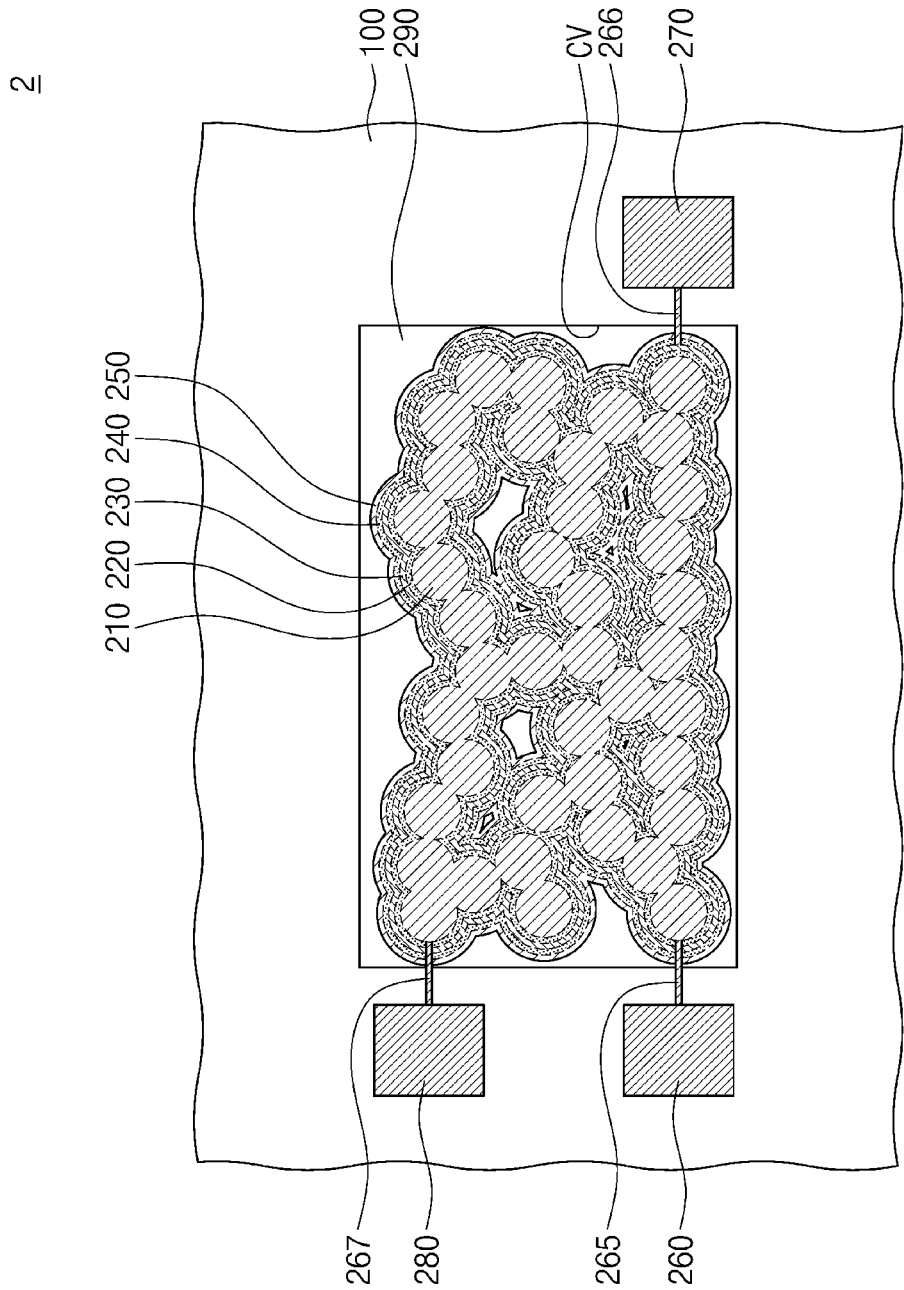
FIG. 9 is a plan view illustrating a semiconductor device according to some embodiments of the present inventive concepts.
Figure 10:
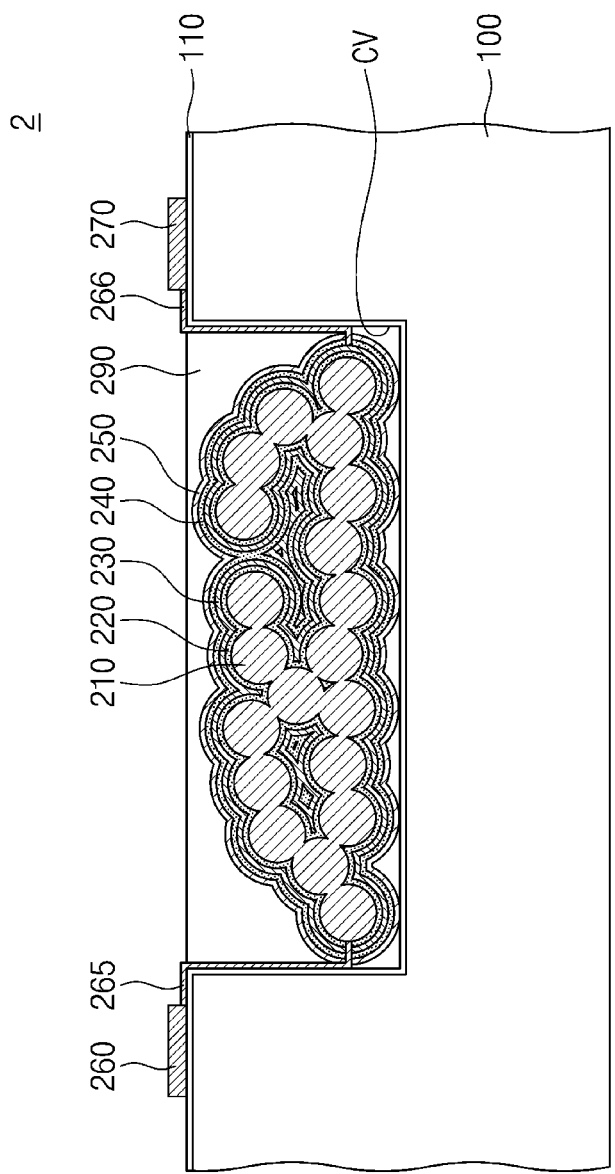
FIG. 10 is a cross-sectional view illustrating a semiconductor device according to some embodiments of the present inventive concepts.

FIG. 9 is a plan view illustrating a semiconductor device according to some embodiments of the present inventive concepts. FIG. 10 is a cross-sectional view illustrating a semiconductor device according to some embodiments of the present inventive concepts. Hereinafter, the descriptions to the same features as mentioned above will be omitted for the purpose of ease and convenience in explanation.

Referring to FIGS. 9 and 10, a semiconductor device 2 may include a substrate 100. The semiconductor device 2 according to some embodiments of the present inventive concepts may include a passive device and may include, for example, a capacitor.

The substrate 100 may be a semiconductor substrate. The substrate 100 may have a recess region CV. An insulating layer 110 may be provided on the substrate 100. The insulating layer 110 may cover a top surface of the substrate 100 and may conformally cover a bottom surface and inner side surfaces of the recess region CV. A capacitor according to some embodiments of the present inventive concepts may be provided in the recess region CV.

The capacitor may include a first electrode 210, a first dielectric layer 220, and a second electrode 230 and may further include a second dielectric layer 240 and a third electrode 250.

The first electrode 210 may have a shape in which particles are connected to each other in a three-dimensional network structure. In an embodiments, particles may contact each other to form the three-dimensional network structure with embossed surfaces. The first dielectric layer 220 may conformally cover a surface (e.g., embossed surfaces) of the first electrode 210. The second electrode 230 may conformally cover a surface of the first dielectric layer 220.

The second dielectric layer 240 may be provided in the recess region CV. The second dielectric layer 240 may cover the second electrode 230. The second dielectric layer 240 may conformally cover a surface of the second electrode 230. The second electrode 230 and the third electrode 250 may be spaced apart from each other by the second dielectric layer 240. The second dielectric layer 240 may include or may be formed of an inorganic material or an organic material. For example, the inorganic material may include or may be at least one of silicon oxide, silicon nitride, glass, tantalum oxide, barium-titanium oxide, strontium-titanium oxide, and a transition metal oxide. For example, the organic material may include or may be at least one of polyvinylidene fluoride (PVDF), silicone, novolac type phenol, resol type phenol, novolac type epoxy, resol type epoxy, poly hydroxy styrene, polyimide, and polybenzoxazoles (PBO). For example, a dielectric constant of the second dielectric layer 240 may range from 2 to 8,000 (i.e., may be a value between 2 and 8,000).

The third electrode 250 may be provided in the recess region CV. The third electrode 250 may cover the second dielectric layer 240. The third electrode 250 may conformally cover a surface of the second dielectric layer 240. The third electrode 250 may include or may be formed of a conductive metal material. For example, the third electrode 250 may include or may be formed of at least one of Cu, Ni, W, Ba, Ti, Sr, Al, Au, Ag, and Ta.

The capacitor may further include a first electrode pad 260, a second electrode pad 270, a third electrode pad 280, a first connection line 265, a second connection line 266, and a third connection line 267. The first electrode pad 260 may be disposed on the top surface of the substrate 100 and may be electrically connected to the first electrode 210. The second electrode pad 270 may be disposed on the top surface of the substrate 100 and may be electrically connected to the second electrode 230.

The third electrode pad 280 may be disposed on the top surface of the substrate 100. The third electrode pad 280 may be horizontally spaced apart from the first electrode pad 260 and the second electrode pad 270. The third electrode pad 280 may be electrically connected to the third electrode 250. The third electrode pad 280 may include or may be formed of a conductive metal material. For example, the third electrode pad 280 may include or may be formed of at least one of Cu, Ni, W, Ba, Ti, Sr, Al, Au, Ag, and Ta.

The first connection line 265 may be disposed between the first electrode 210 and the first electrode pad 260. The second connection line 266 may be disposed between the second electrode 230 and the second electrode pad 270. The third connection line 267 may be disposed between the third electrode 250 and the third electrode pad 280. The first electrode 210 and the first electrode pad 260 may be electrically connected with each other through the first connection line 265. The second electrode 230 and the second electrode pad 270 may be electrically connected with each other through the second connection line 266. The third electrode 250 and the third electrode pad 280 may be electrically connected with each other through the third connection line 267. The third connection line 267 may include or may be formed of a conductive metal material and may include or may be formed of at least one of, for example, Cu, Ni, W, Ba, Ti, Sr, Al, Au, Ag, and Ta.

A molding layer 290 may be disposed in the recess region CV. The molding layer 290 may fill a remaining portion of the recess region CV and may cover the third electrode 250. The molding layer 290 may expose a top surface of the first electrode pad 260, a top surface of the second electrode pad 270, and a top surface of the third electrode pad 280.

The capacitor according to the embodiments of the present inventive concepts may have a three-dimensional network structure. More particularly, the first electrode 210, the first dielectric layer 220, the second electrode 230, the second dielectric layer 240 and the third electrode 250 may have the three-dimensional network structure. In an embodiment, the three-dimensional network structure may have embossed surfaces. Thus, surface areas of the first electrode 210, the second electrode 230 and the third electrode 250 may be increased to improve a capacitance of the capacitor. In particular, since the capacitor further includes the third electrode 250, a surface area of the electrode may be maximized to more improve the capacitance of the capacitor.

Figure 11:
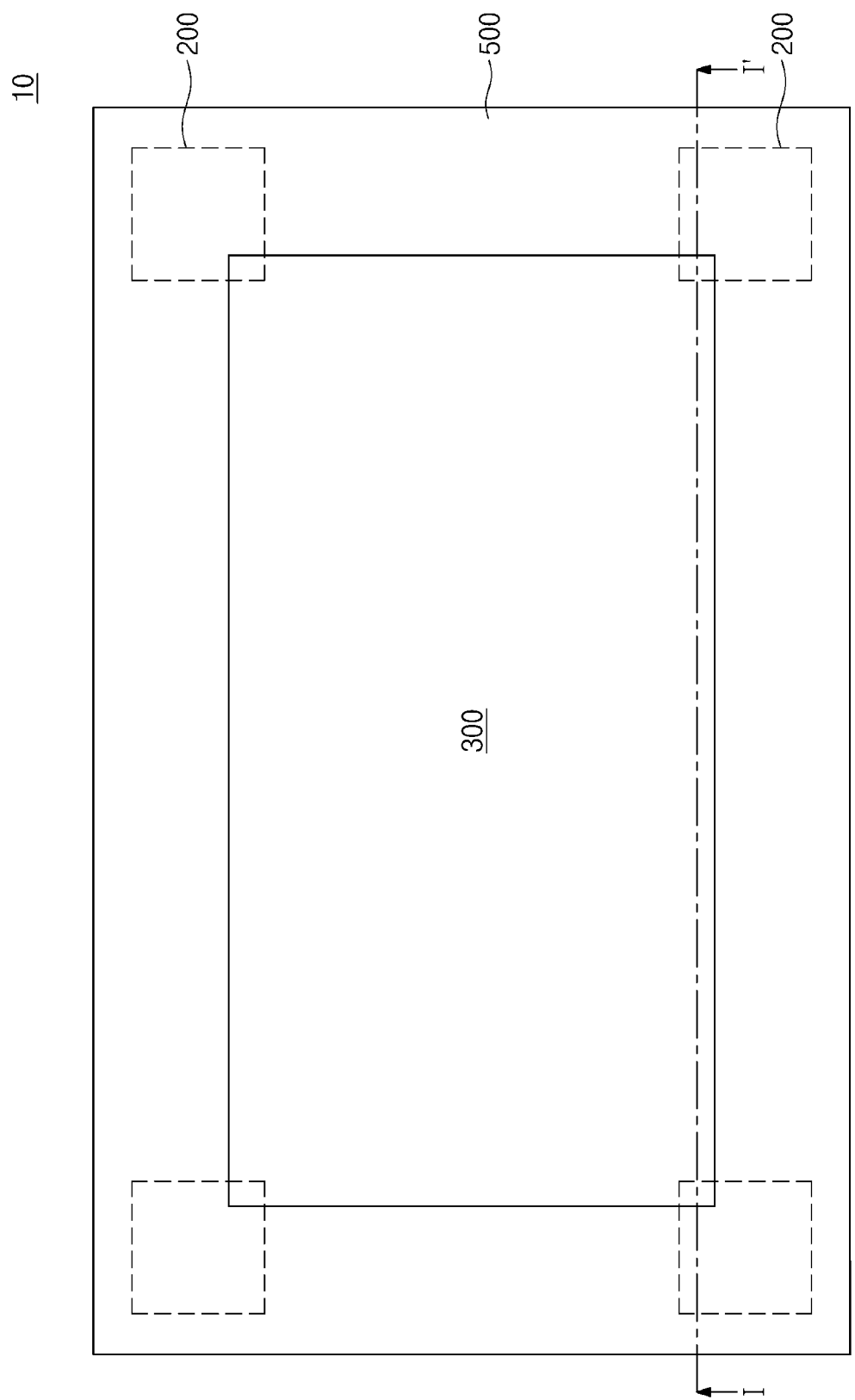
FIG. 11 is a plan view illustrating a semiconductor package including a semiconductor device according to some embodiments of the present inventive concepts.
Figure 12:
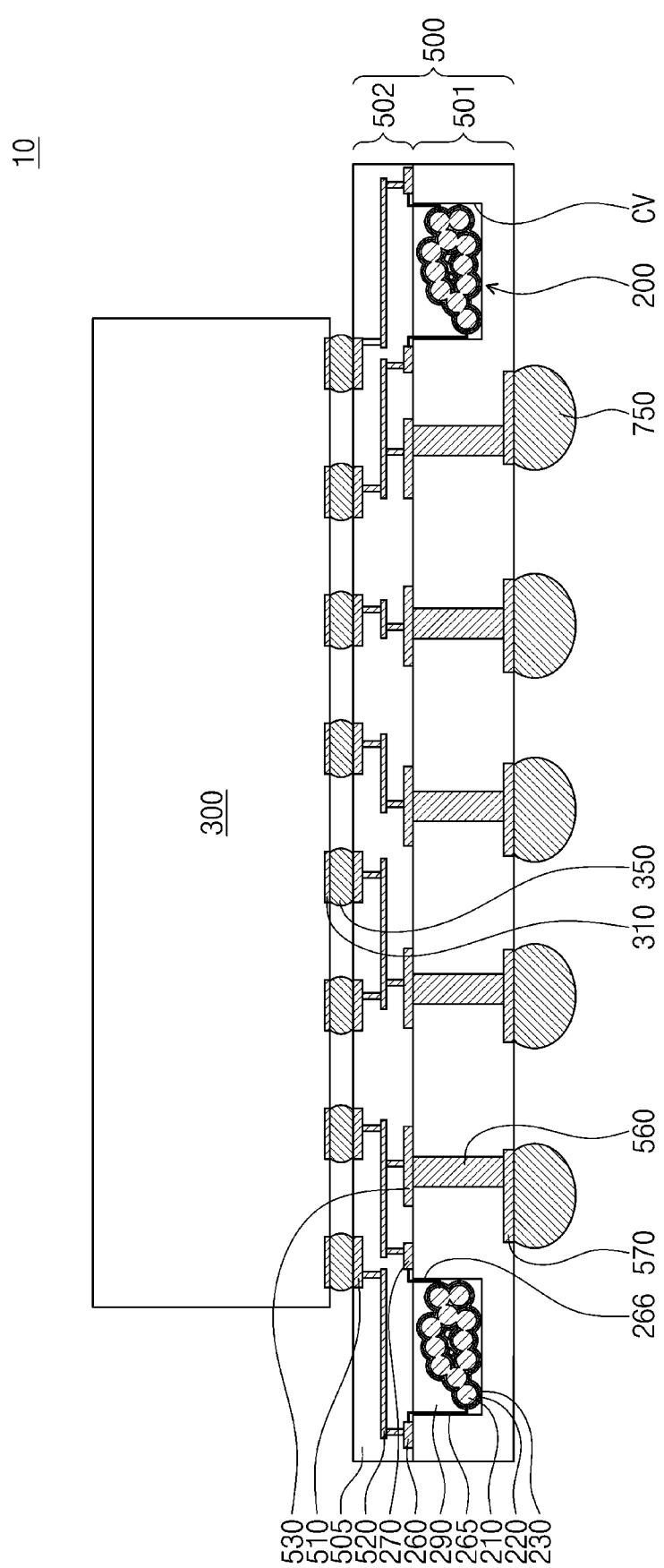
FIG. 12 is a cross-sectional view taken along line I-I' of FIG. 11.

FIG. 11 is a plan view illustrating a semiconductor package including a semiconductor device according to some embodiments of the present inventive concepts. FIG. 12 is a cross-sectional view taken along line I-I' of FIG. 11.

Referring to FIGS. 11 and 12, a semiconductor package 10 may include an interposer substrate 500 and a semiconductor chip 300.

The interposer substrate 500 may include a substrate layer 501 and an interconnection layer 502 on the substrate layer 501. The interposer substrate 500 may include a capacitor 200 according to the present inventive concepts.

The substrate layer 501 may include a plurality of through-electrodes 560 and lower pads 570. For example, the substrate layer 501 may be a silicon substrate. The substrate layer 501 may have a recess region CV. The recess region CV may be a region in which a portion of a top surface of the substrate layer 501 is recessed toward a bottom surface of the substrate layer 501. The capacitor 200 may be provided in the substrate layer 501. The capacitor 200 may be provided in the recess region CV. Even though not shown in FIG. 10, an insulating layer may conformally cover a bottom surface and inner side surfaces of the recess region CV. For example, the insulating layer may include or may be formed of at least one of silicon oxide, silicon nitride, and silicon oxynitride.

The capacitor 200 may include a first electrode 210, a first dielectric layer 220, and a second electrode 230. The first electrode 210 may have a shape in which particles are connected to each other in a three-dimensional network structure. In an embodiment, particles may contact each other to form a three-dimensional network structure with embossed surfaces. The particles may be connected to each other by a sintering process to form the first electrode 210. The first dielectric layer 220 may conformally cover a surface of the first electrode 210. The second electrode 230 may conformally cover a surface of the first dielectric layer 220.

The capacitor 200 may further include a first electrode pad 260, a second electrode pad 270, a first connection line 265, and a second connection line 266. The first electrode pad 260 may be disposed on the top surface of the substrate layer 501 and may be electrically connected to the first electrode 210. The second electrode pad 270 may be disposed on the top surface of the substrate layer 501 and may be electrically connected to the second electrode 230. The first connection line 265 may be disposed between the first electrode 210 and the first electrode pad 260. The second connection line 266 may be disposed between the second electrode 230 and the second electrode pad 270. The first electrode 210 and the first electrode pad 260 may be electrically connected with each other through the first connection line 265. The second electrode 230 and the second electrode pad 270 may be electrically connected with each other through the second connection line 266.

A molding layer 290 may be disposed in the recess region CV. The molding layer 290 may fill a remaining portion of the recess region CV and may cover the second electrode 230. The molding layer 290 may expose a top surface of the first electrode pad 260 and a top surface of the second electrode pad 270.

The through-electrodes 560 may be disposed in the substrate layer 501 and may penetrate the substrate layer 501. Each of the through-electrodes 560 may be electrically connected to a corresponding one of upper substrate interconnection lines 530, which will be described later. The lower pads 570 may be disposed adjacent to the bottom surface of the substrate layer 501. The lower pads 570 may be electrically connected to the through-electrodes 560. The plurality of through-electrodes 560 and the lower pads 570 may include or may be formed of a conductive metal material and may include or may be formed of at least one metal of, for example, Cu, Al, W, and Ti.

The interconnection layer 502 may include upper pads 510, internal interconnection lines 520, upper substrate interconnection lines 530, and an interconnection insulating layer 505. The interconnection insulating layer 505 may cover the upper pads 510, the internal interconnection lines 520, and the upper substrate interconnection lines 530. The upper pads 510 may be disposed adjacent to a top surface of the interconnection layer 502, and the upper substrate interconnection lines 530 may be disposed adjacent to a bottom surface of the interconnection layer 502. The upper pads 510 may be exposed at the top surface of the interconnection layer 502. The internal interconnection lines 520 may be disposed in the interconnection insulating layer 505 and may be electrically connected to the upper pads 510 and the upper substrate interconnection lines 530. The internal interconnection lines 520 may be electrically connected to the first electrode pad 260 and the second electrode pad 270. The semiconductor chip 300 may be electrically connected to the first electrode pad 260 and the second electrode pad 270 through the internal interconnection lines 520. The upper pads 510, the internal interconnection lines 520 and the upper substrate interconnection lines 530 may include or may be formed of a conductive metal material and may include or may be formed of at least one metal of, for example, Cu, Al, W, and Ti.

External terminals 750 may be provided on a bottom surface of the interposer substrate 500. The external terminals 750 may be disposed on bottom surfaces of the lower pads 570. The external terminals 750 may be connected to an external device. Thus, external electrical signals may be transmitted to the interposer substrate 500 through the external terminals 750. Each of the external terminals 750 may have at least one shape of a solder ball, a bump, and a pillar. The external terminals 750 may include or may be formed of a conductive metal material and may include or may be formed of at least one metal of, for example, Sn, Pb, Ag, Zn, Ni, Au, Cu, Al, and Bi.

The semiconductor chip 300 may be mounted on a top surface of the interposer substrate 500. The semiconductor chip 300 may include a memory chip or a logic chip, but embodiments of the present inventive concepts are not limited thereto. The semiconductor chip 300 may include chip pads 310 adjacent to a bottom surface. The chip pads 310 may include or may be formed of a conductive metal material and may include or may be formed of at least one metal of, for example, Cu, Al, W, and Ti.

Connection bumps 350 may be disposed between the interposer substrate 500 and the semiconductor chip 300. The connection bumps 350 may be disposed between the upper pads 510 and the chip pads 310. The interposer substrate 500 and the semiconductor chip 300 may be electrically connected with each other through the connection bumps 350. Each of the connection bumps 350 may have at least one shape of a solder ball, a bump, and a pillar. The connection bumps 350 may include or may be formed of a conductive metal material and may include or may be formed of at least one metal of, for example, Sn, Pb, Ag, Zn, Ni, Au, Cu, Al, and Bi.

Unlike FIG. 12, in some embodiments, the capacitor 200 may further include the second dielectric layer 240, the third electrode 250, the third electrode pad 280 and the third connection line 267, as described with reference to FIGS. 9 and 10. The second dielectric layer 240 may conformally cover a surface of the second electrode 230. The third electrode 250 may conformally cover a surface of the second dielectric layer 240. The second electrode 230 and the third electrode 250 may be spaced apart from each other by the second dielectric layer 240. The third electrode pad 280 may be disposed on the top surface of the substrate layer 501 and may be electrically connected to the third electrode 250. The third connection line 267 may be disposed between the third electrode 250 and the third electrode pad 280. The third electrode 250 and the third electrode pad 280 may be electrically connected with each other through the third connection line 267.

Figure 13:
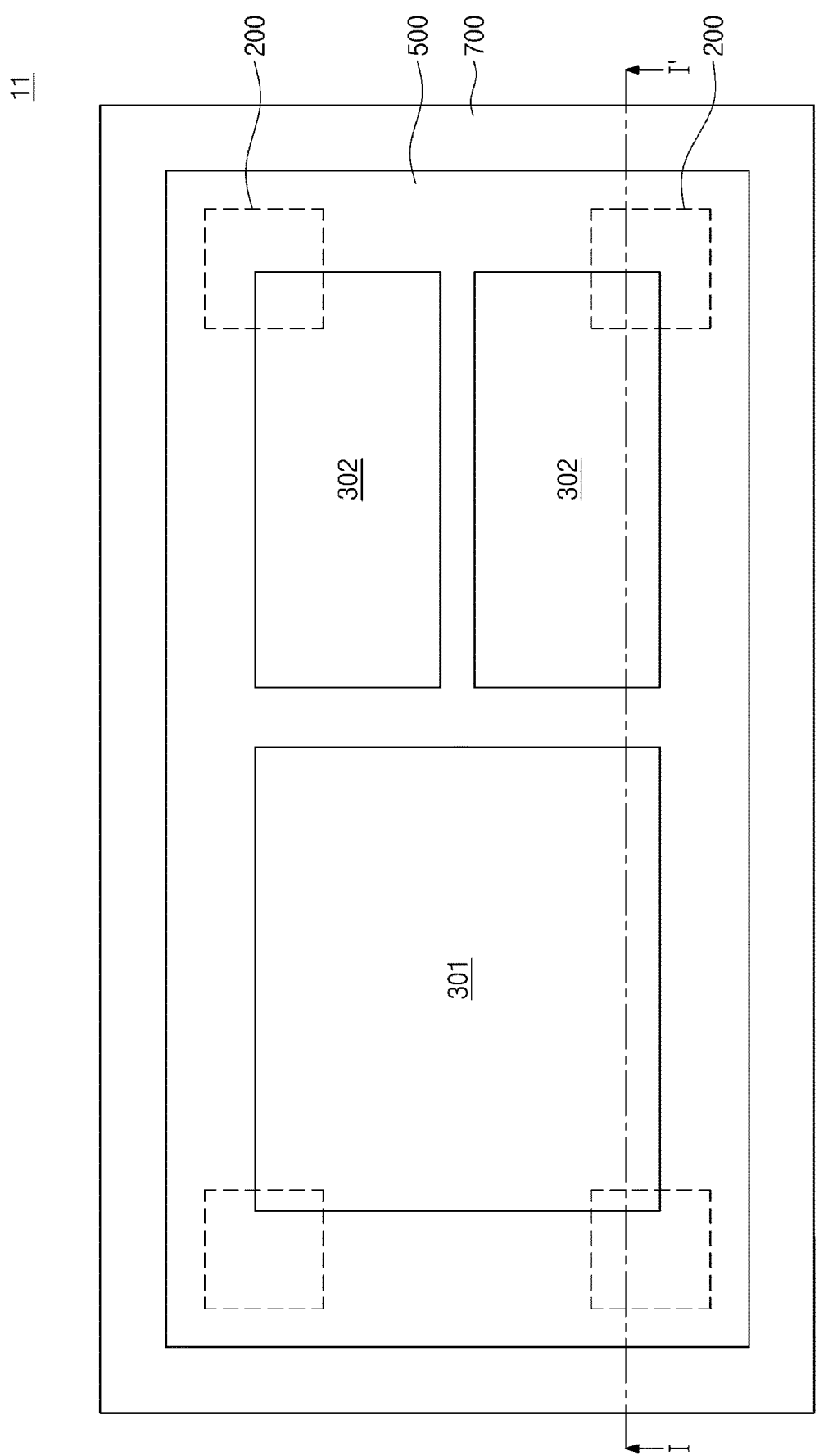
FIG. 13 is a plan view illustrating a semiconductor package including a semiconductor device according to some embodiments of the present inventive concepts.
Figure 14:
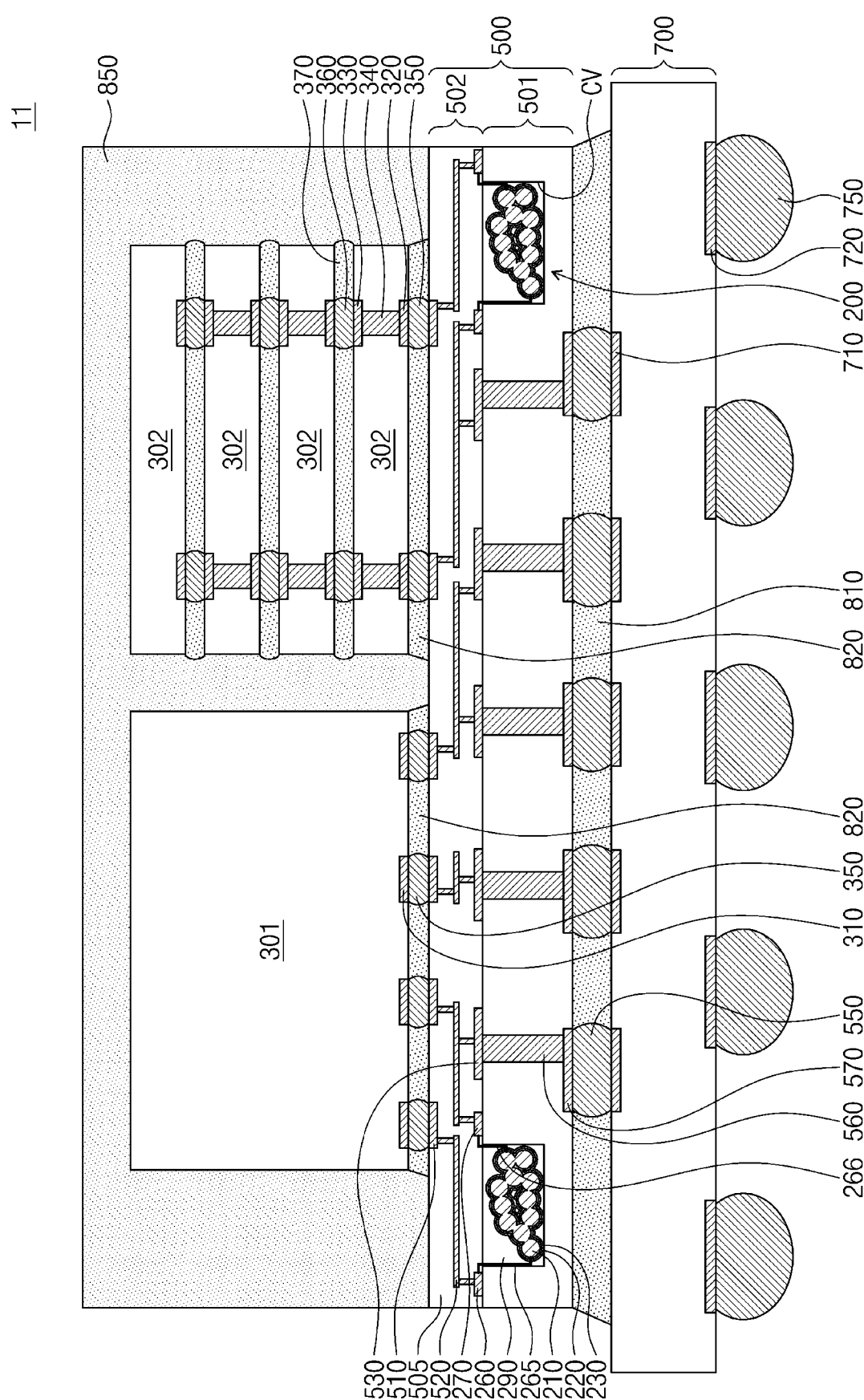
FIG. 14 is a cross-sectional view taken along line I-I' of FIG. 13.

FIG. 13 is a plan view illustrating a semiconductor package including a semiconductor device according to some embodiments of the present inventive concepts. FIG. 14 is a cross-sectional view taken along line I-I' of FIG. 13.

Referring to FIGS. 13 and 14, a semiconductor package 11 may include a package substrate 700, an interposer substrate 500, a first semiconductor chip 301, and a second semiconductor chip 302.

The package substrate 700 may include package substrate pads 710 and terminal pads 720. For example, the package substrate 700 may be a printed circuit board (PCB). The package substrate pads 710 may be disposed adjacent to a top surface of the package substrate 700, and the terminal pads 720 may be disposed adjacent to a bottom surface of the package substrate 700. The package substrate pads 710 may be exposed at the top surface of the package substrate 700. The terminal pads 720 may be exposed at the bottom surface of the package substrate 700. The package substrate pads 710 and the terminal pads 720 may include or may be formed of a conductive metal material and may include or may be formed of at least one metal of, for example, Cu, Al, W, and Ti.

External terminals 750 may be provided on the bottom surface of the package substrate 700. The external terminals 750 may be disposed on bottom surfaces of the terminal pads 720. The external terminals 750 may be connected to an external device. Thus, external electrical signals may be transmitted to the package substrate 700 through the external terminals 750.

The interposer substrate 500 may be disposed on the package substrate 700. The interposer substrate 500 may include a substrate layer 501 and an interconnection layer 502 on the substrate layer 501. The interposer substrate 500 may include a capacitor 200 according to the present inventive concepts. The interposer substrate 500 and the capacitor 200 may be the same as described above with reference to FIGS. 11 and 12.

Substrate bumps 550 may be disposed between the package substrate 700 and the interposer substrate 500. The package substrate 700 and the interposer substrate 500 may be electrically connected with each other through the substrate bumps 550. Each of the substrate bumps 550 may have at least one shape of a solder ball, a bump, and a pillar. The substrate bumps 550 may include or may be formed of a conductive metal material and may include or may be formed of at least one metal of, for example, Sn, Pb, Ag, Zn, Ni, Au, Cu, Al, and Bi. A pitch of the substrate bumps 550 may be less than a pitch of the external terminals 750. The pitch refers to the shortest distance between two adjacent elements such as the bumps 550 and the external terminals 750.

A substrate underfill layer 810 may be disposed between the package substrate 700 and the interposer substrate 500. The substrate underfill layer 810 may fill a space between the substrate bumps 550 and may seal or encapsulate the substrate bumps 550. For example, the substrate underfill layer 810 may include or may be a non-conductive film (NCF) such as an Ajinomoto build-up film (ABF).

The first semiconductor chip 301 may be mounted on a top surface of the interposer substrate 500. The first semiconductor chip 301 may include a logic chip, a buffer chip, or a system-on-chip (SOC). For example, the first semiconductor chip 301 may be an ASIC chip or an application processor (AP) chip. The ASIC chip may include an application specific integrated circuit (ASIC). The first semiconductor chip 301 may include a central processing unit (CPU) or a graphic processing unit (GPU). The first semiconductor chip 301 may include chip pads 310 adjacent to a bottom surface of the first semiconductor chip 301.

A plurality of the second semiconductor chips 302 may be mounted on the top surface of the interposer substrate 500. The second semiconductor chips 302 may be horizontally spaced apart from the first semiconductor chip 301. The second semiconductor chips 302 may be vertically stacked on the interposer substrate 500 to constitute a chip stack. In some embodiments, the chip stack may be provided in plurality (i.e., may include multiple stackings vertically stacked on the interposer substrate 500). A kind of the second semiconductor chips 302 may be different from a kind of the first semiconductor chip 301. The second semiconductor chips 302 may be memory chips. The memory chips may include high bandwidth memory (HBM) chips. For example, the second semiconductor chips 302 may include DRAM chips. However, the numbers of multiple stackings in the chip stack, the first semiconductor chip 301 and the second semiconductor chips 302 may be variously changed, unlike FIGS. 13 and 14.

Each of the second semiconductor chips 302 may include integrated circuits (not shown) and through-vias 340. The integrated circuits may be provided in the second semiconductor chips 302. The through-vias 340 may penetrate a corresponding second semiconductor chip 302 of the second semiconductor chips 302 and may be electrically connected to the integrated circuits. The through-vias 340 may include or may be formed of a conductive metal material and may include or may be formed of at least one metal of, for example, Cu, Al, W, and Ti. However, in some embodiments, an uppermost second semiconductor chip 302 may not include the through-vias 340.

Each of the second semiconductor chips 302 may include first chip pads 320 adjacent to a bottom surface of the second semiconductor chip 302 and second chip pads 330 adjacent to a top surface of the second semiconductor chip 302. However, the second chip pads 330 may not be provided at a top surface of the uppermost second semiconductor chip 302. The first chip pads 320 and the second chip pads 330 may include or may be formed of a conductive metal material and may include or may be formed of at least one metal of, for example, Cu, Al, W, and Ti.

Upper bumps 360 may be disposed between adjacent two second semiconductor chips 302. The upper bumps 360 may be electrically connected to the through-vias 340 of a corresponding second semiconductor chip 302. The second semiconductor chips 302 may be electrically connected with each other through the upper bumps 360.

A chip underfill layer 370 may be disposed between adjacent two second semiconductor chips 302 of the second semiconductor chips 302. The chip underfill layer 370 may fill a space between the upper bumps 360 and may seal or encapsulate the upper bumps 360. For example, the chip underfill layer 370 may include or may be a non-conductive film (NCF) such as an Ajinomoto build-up film (ABF).

Connection bumps 350 may be disposed between the interposer substrate 500 and the first semiconductor chip 301 and between the interposer substrate 500 and a lowermost second semiconductor chip 302. Through the connection bumps 350, the interposer substrate 500 and the first semiconductor chip 301 may be electrically connected with each other, and the interposer substrate 500 and the lowermost second semiconductor chip 302 may be electrically connected with each other.

A chip underfill layer 820 may be disposed between the interposer substrate 500 and the first semiconductor chip 301 and between the interposer substrate 500 and the lowermost second semiconductor chip 302. The chip underfill layer 820 may fill a space between the connection bumps 350 and may seal or encapsulate the connection bumps 350. For example, the chip underfill layer 820 may include or may be a non-conductive film (NCF) such as an Ajinomoto build-up film (ABF).

A chip molding layer 850 may be provided on the interposer substrate 500. The chip molding layer 850 may cover the top surface of the interposer substrate 500, the first semiconductor chip 301, and the second semiconductor chips 302. In some embodiments, the chip molding layer 850 may cover a top surface of the first semiconductor chip 301 and the top surface of the uppermost second semiconductor chip 302. In some embodiments, unlike FIG. 14, the chip molding layer 850 may expose the top surface of the first semiconductor chip 301 and the top surface of the uppermost second semiconductor chip 302. For example, the chip molding layer 850 may include or may be formed of an insulating polymer such as an epoxy molding compound (EMC).

The capacitor according to the embodiments of the present inventive concepts may have the three-dimensional network structure. More particularly, the first electrode, the dielectric layer and the second electrode may have the three-dimensional network structure. Thus, the surface areas of the first and second electrodes may be maximized to improve the capacitance of the capacitor.

According to the present inventive concepts, the sintering process for connecting the conductive particles may be performed to form the first electrode. Since the capacitor is manufactured in the relatively mild process conditions, occurrence of a defect in the dielectric layer may be prevented, and the manufacturing processes may be simplified. As a result, according to the present inventive concepts, the semiconductor device with improved reliability may be provided.

While example embodiments of the present inventive concepts have been particularly shown and described, it will be understood by one of ordinary skill in the art that variations in form and detail may be made therein without departing from the spirit and scope of the attached claims.

What is claimed is:

1. A semiconductor device comprising:
a substrate having a recess region;
a first electrode in the recess region and having a three-dimensional network structure;
a first dielectric layer in the recess region and covering the first electrode;
a second electrode in the recess region and covering the first dielectric layer; and
a molding layer filling a remaining portion of the recess region and covering the second electrode,
wherein the first electrode includes a plurality of particles that are connected with each other in the three-dimensional network structure.

2. The semiconductor device of claim 1,
wherein the three-dimensional network structure of the first electrode has first embossed surfaces,
wherein the first dielectric layer conformally covers the first embossed surfaces of the first electrode to have second embossed surfaces, and
wherein the second electrode conformally covers the second embossed surfaces of the first dielectric layer.

3. The semiconductor device of claim 1, further comprising:
a second dielectric layer conformally covering the second electrode; and
a third electrode conformally covering the second dielectric layer.

4. The semiconductor device of claim 1, further comprising:
a first electrode pad on the substrate and connected to the first electrode; and
a second electrode pad on the substrate and connected to the second electrode.

5. The semiconductor device of claim 4,
wherein the molding layer exposes a top surface of the first electrode pad and a top surface of the second electrode pad.

6. The semiconductor device of claim 1,
wherein the three-dimensional network structure of the first electrode has embossed surfaces.

7. The semiconductor device of claim 6,
wherein the plurality of particles include at least one of metal particles and polymer particles covered with metal.

8. The semiconductor device of claim 7,
wherein the metal includes at least one of Cu, Ni, W, Ba, Ti, Sr, Al, Au, Ag, and Ta.

9. The semiconductor device of claim 1,
wherein the second electrode includes at least one of Cu, Ni, W, Ba, Ti, Sr, Al, Au, Ag, and Ta.

10. The semiconductor device of claim 1,
wherein the first electrode and the second electrode are spaced apart from each other by the first dielectric layer.

11. A semiconductor package comprising:
an interposer substrate; and
a semiconductor chip mounted on a top surface of the interposer substrate,
wherein the interposer substrate comprises:
a substrate layer having a recess region;
a capacitor in the recess region; and
an interconnection layer on the substrate layer,
wherein the capacitor comprises:
a first electrode having a three-dimensional network structure, wherein the three-dimensional network structure of the first electrode has first embossed surfaces;
a first dielectric layer covering the first embossed surfaces of the first electrode to have second embossed surfaces; and
a second electrode covering the second embossed surfaces of the first dielectric layer.

12. The semiconductor package of claim 11, further comprising:
a molding layer filling a remaining portion of the recess region and covering the second electrode.

13. The semiconductor package of claim 11,
wherein the capacitor further comprises:
a second dielectric layer conformally covering the second electrode; and
a third electrode conformally covering the second dielectric layer.

14. The semiconductor package of claim 13,
wherein the second electrode and the third electrode are spaced apart from each other by the second dielectric layer.

15. The semiconductor package of claim 11,
wherein the capacitor further comprises:
a first electrode pad on the substrate layer and connected to the first electrode; and
a second electrode pad on the substrate layer and connected to the second electrode.

16. The semiconductor package of claim 15,
wherein the interconnection layer comprises:
an interconnection insulating layer; and
a plurality of internal interconnection lines in the interconnection insulating layer, and
wherein the semiconductor chip is electrically connected to the first electrode pad and the second electrode pad through the plurality of internal interconnection lines.

17. The semiconductor package of claim 11,
wherein the substrate layer comprises:
a plurality of through-electrodes penetrating the substrate layer; and
a plurality of lower pads adjacent to a bottom surface of the substrate layer.

18. A semiconductor package comprising:
an interposer substrate comprising a capacitor therein;
a first semiconductor chip mounted on a top surface of the interposer substrate; and
a plurality of external terminals on a bottom surface of the interposer substrate,
wherein the capacitor comprises:
a first electrode having a three-dimensional network structure in which a plurality of particles are connected with each other;
a first dielectric layer covering the first electrode;
a second electrode covering the first dielectric layer;

a first electrode pad connected to the first electrode; and
a second electrode pad connected to the second electrode.

19. The semiconductor package of claim 18, further comprising:
a package substrate on the bottom surface of the interposer substrate; and
a second semiconductor chip mounted on the top surface of the interposer substrate and horizontally spaced apart from the first semiconductor chip.

20. The semiconductor package of claim 19,
wherein a kind of the first semiconductor chip is different from a kind of the second semiconductor chip.

* * * * *